US006362070B1

(12) United States Patent
Villa et al.

(10) Patent No.: US 6,362,070 B1
(45) Date of Patent: Mar. 26, 2002

(54) PROCESS FOR MANUFACTURING A SOI WAFER WITH BURIED OXIDE REGIONS WITHOUT CUSPS

(75) Inventors: Flavio Villa, Milan; Gabriele Barlocchi, Cornaredo; Pietro Corona, Rome, all of (IT)

(73) Assignee: STMicroelectronics S.R.L., Agrate Brianza (IT)

( * ) Notice: Subject to any disclaimer, the term of this patent is extended or adjusted under 35 U.S.C. 154(b) by 0 days.

(21) Appl. No.: 09/558,934

(22) Filed: Apr. 26, 2000

(30) Foreign Application Priority Data

Apr. 29, 1999 (EP) .............................. 99830256

(51) Int. Cl.$^7$ ............................... H01L 21/76
(52) U.S. Cl. ..................... 438/404; 438/405; 438/407; 438/413; 438/528
(58) Field of Search ................. 438/404, 405, 438/407, 410, 413, 445, 528

(56) References Cited

U.S. PATENT DOCUMENTS

| 4,361,600 | A | * | 11/1982 | Brown |
| 4,604,162 | A | * | 8/1986 | Sobczak |
| 4,685,198 | A |   | 8/1987 | Kawakita et al. |
| 4,814,287 | A | * | 3/1989 | Takemoto et al. |
| 4,845,048 | A | * | 7/1989 | Tamaki et al. |
| 5,025,302 | A |   | 6/1991 | Soclof |
| 5,691,230 | A |   | 11/1997 | Forbes |
| 5,907,783 | A | * | 5/1999 | Kim et al. .................. 438/407 |
| 6,238,998 | B1 | * | 5/2001 | Leobandung ............... 438/404 |

FOREIGN PATENT DOCUMENTS

EP    0 488 344    6/1992

OTHER PUBLICATIONS

Berruyer, Pascale and M. Bruel, "Nitrogen Implantation for Local Inhibition of Oxidation," *Appl. Phys. Lett.*, 50(2):89–91, Jan. 1987.

Kakoschke, R. et al., "Trench Sidewall Implantation with a Parallel Scanned Ion Beam," published in *IEEE Trans. Elec. Dev.*, Semiconductor Equipment Group, Report No. 182:1–8, Nov. 1989.

* cited by examiner

*Primary Examiner*—Trung Dang
(74) *Attorney, Agent, or Firm*—Lisa Jorgenson; E. Russell Tarleton; Seed IP Law Group PLLC

(57) ABSTRACT

A process for manufacturing a SOI wafer with buried oxide regions without cusps that includes forming, in a wafer of monocrystalline semiconductor material, trenches extending between, and delimiting laterally, protruding regions; forming masking regions, implanted with nitrogen ions, the masking regions surrounding completely the tips of the protruding regions; and forming retarding regions on the bottom of the trenches, wherein nitrogen is implanted at a lower dose than the masking regions. A thermal oxidation is then carried out and starts at the bottom portion of the protruding regions and then proceeds downwards; thereby, a continuous region of buried oxide is formed and is overlaid by non-oxidized regions corresponding to the tips of the protruding regions and forming nucleus regions for a subsequent epitaxial growth. The masking regions and the retarding regions are formed through two successive implants, including an angle implant, wherein the protruding regions shield the bottom portions of the adjacent protruding regions, as well as the bottom of the trenches, and a vertical implant is made perpendicularly to the wafer.

20 Claims, 8 Drawing Sheets

PROCESS FOR MANUFACTURING A SOI WAFER WITH BURIED OXIDE REGIONS WITHOUT CUSPS

TECHNICAL FIELD

The present invention regards an improved process for manufacturing a SOI wafer with buried oxide regions without cusps.

BACKGROUND OF THE INVENTION

As known, according to present designs in the microelectronics industry, the substrate of integrated devices is obtained from monocrystalline silicon wafers. In the last few years, as an alternative to just silicon wafers, composite wafers have been proposed, so-called SOI (Silicon-on-Insulator) wafers formed by two silicon layers, one of which is thinner than the other, separated by a silicon oxide layer.

A process for manufacturing SOI wafers is the subject of European Patent Application No. 98830007.5 filed on Jan. 13, 1998 in the name of STMicroelectronics, S.r.l. and is described hereinafter with reference to FIGS. 1 to 8.

According to this process, on a surface 3 of a substrate 2 a first silicon oxide layer is initially grown and has a thickness comprised between, for example, 20 and 60 nm. Then a first silicon nitride layer with a thickness comprised between 90 and 150 nm is deposited. Using a resist mask, the uncovered portions of the first oxide layer and the first nitride layer are etched, and the resist mask is then removed to obtain the intermediate structure of FIG. 1, where the wafer thus obtained is indicated, as a whole, by 1, and the portions of the first oxide layer and of the first nitride layer remaining after dry etching are indicated by 4 and 5, and define respective first protective regions 7 covering first portions 8' of the substrate 2.

The first protective regions 7 form a hard mask, indicated as a whole by 9, used for etching the substrate 2 at second portions 8" left uncovered by the mask 9 so as to form initial trenches 10 (FIG. 2).

Subsequently, as shown in FIG. 3, the wafer 1 is oxidized, thus forming a second oxide layer 11, having a thickness comprised between, for example, 20 and 60 nm, covering the walls and the bottom of the initial trenches 10, and then a second silicon nitride layer 12 is deposited for a thickness comprised between 90 and 150 nm.

Next, the layers 12 and 11 are etched anisotropically in an unmasked way. Given the etching anisotropy, the horizontal portions of the second silicon nitride layer 12 and of the silicon oxide layer 11 on the bottom of the initial trenches 10, as well as the portion of the second silicon nitride layer 12 on top of the portions 4 and 5 are removed to yield the intermediate structure of FIG. 4, wherein the regions 8' are still covered on top by the mask 9 and laterally (on the vertical walls of the initial trenches 10) by oxide and nitride portions 11' and 12'. Instead, the substrate 2 is bare on the bottom 15 of the initial trenches 10.

Then the uncovered silicon at the bottom 15 of the initial trenches 10 are etched to deepen the initial trenches 10 until final trenches 16 are obtained having a desired depth. In particular, the depth of the final trenches 16 determines the dimensions of the desired buried oxide layer, and hence the electrical characteristics of the SOI wafer, as clarified hereinafter, which is determined according to the requirements for the final SOI wafer.

The substrate 2 is now formed by a base portion indicated by 2' and by a number of "columns" 18 extending vertically from the base portion 2'. The intermediate structure of FIG. 5 is thus obtained, wherein the nitride portions 5 and 12' are no longer distinct from each another and are indicated by 19; also the oxide portions 4 and 11' are no longer distinct from each another and are indicated by 20, and form, together with the portions 19, second protective regions 30.

A thermal oxidation is then carried out, so that the exposed silicon regions of the "columns" 18 are converted into silicon oxide. In practice, a gradual growth of the oxide regions is obtained at the expense of the silicon regions, starting from the side walls of the final trenches 16 towards the inside of the columns, and in part also towards and inside the base portion 2'. Since during oxidation the volume increases, the oxide regions being formed occupy, gradually, the space of the final trenches 16 until they completely close the trenches and join together. The oxidation ends automatically once the columns 18 have completely oxidized (apart from the top area or tip, indicated by 21, which is protected by the second protective regions 30) to form a continuous region of buried oxide 22, illustrated in FIG. 6, wherein continuous vertical lines indicate the surfaces on which the oxide regions being formed meet starting from walls of two adjacent final trenches 16, so as to highlight the oxide expansion.

Subsequently, by selective etching, the second protective regions 30 are removed so as to uncover the "tips" 21, which form the nucleus for subsequent epitaxial growth.

The structure of FIG. 7, which shows the three-dimensional structure of the wafer 1 in this step, is obtained. Subsequently, epitaxial growth is performed, the parameters of which are chosen so as to prevent nucleation of the silicon in the areas overlying the buried oxide region 22, and a high side growth/vertical growth ratio is chosen so as to obtain first a horizontal growth of the silicon around the tips 21 (and hence the coating of the top surface of the buried oxide region 22), and subsequently the vertical growth of an epitaxial layer 23. After a possible chemical and mechanical lapping to flatten the top surface of the wafer 1, the final structure of wafer 1 shown in FIG. 8 is thus obtained.

Thereby, it is possible to make a SOI wafer employing only processing steps that are commonly used in microelectronics, with costs that are much lower than those of the processes currently employed for making SOI substrates.

The above described manufacturing process presents, however, the drawback that the shape of the buried oxide region 22 is not ideal. In fact, as highlighted in the enlarged detail of FIG. 9, during thermal oxidation, the exposed silicon regions of the "columns" 18 are oxidized following the curved lines, so that the buried oxide region 22 presents, at the bottom, a shape defined by a series of arches 35 and, at the top, a shape defined by a series of cusps 37 extending upwards at each wall of the final trenches 16. In addition, inside the buried oxide region 22 voids 38 are formed. This shape of the buried oxide region 22 thus renders the step of epitaxial growth of the silicon to form the SOI wafer critical, and, in any case, the shape of the bottom surface of the epitaxial layer 23 creates problems in forming suspended masses.

SUMMARY OF THE INVENTION

The disclosed embodiments of the present invention is therefore to overcome the drawbacks of the above described manufacturing process. According to the present invention, a process for manufacturing SOI wafers is provided, including forming trenches in a wafer of monocrystalline semiconductor material, the trenches extending between and delimiting laterally protruding portions of the wafer; oxidizing at the bottom of the protruding portions and subsequently oxidizing the wafer underneath the trenches and underneath the bottom portions of the protruding portions to form at least one continuous buried oxide region overlaid by nucleus regions of the monocrystalline semiconductor material; and epitaxially growing a layer of crystalline semiconductor material starting from the nucleus regions.

In accordance with another aspect of the foregoing process, the forming of trenches includes forming masking regions that surround top portions of the protruding portions at the top and at the sides; forming retarding regions on the bottom of the trenches, with the masking regions and the retarding regions delimiting between each other oxidizable surfaces surrounding the bottom portions of the protruding portions.

BRIEF DESCRIPTION OF THE DRAWINGS

For a better understanding of the present invention, a preferred embodiment thereof is now described, as a non-limiting example, with reference to the attached drawings, wherein.

DETAILED DESCRIPTION OF THE INVENTION

The invention is described hereinafter with reference to FIGS. 10 to 19.

Figure 10:
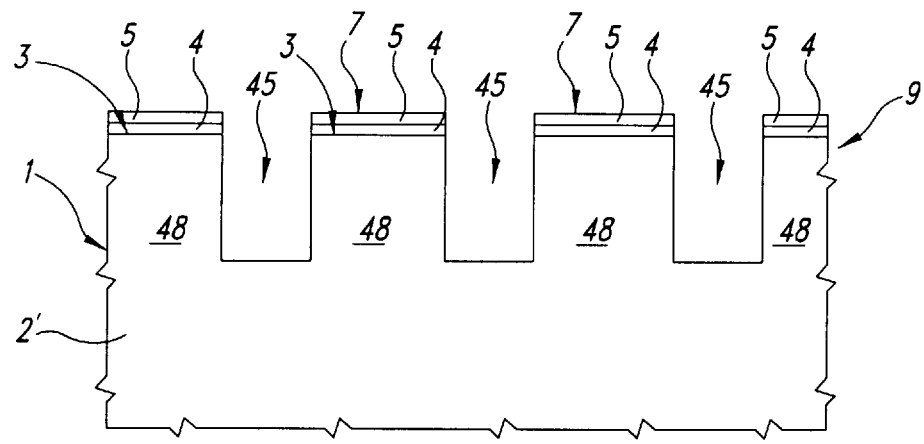
FIGS. 10 to 17 show cross sections through a SOI wafer corresponding to the manufacturing process according to the present process.
Figure 11:
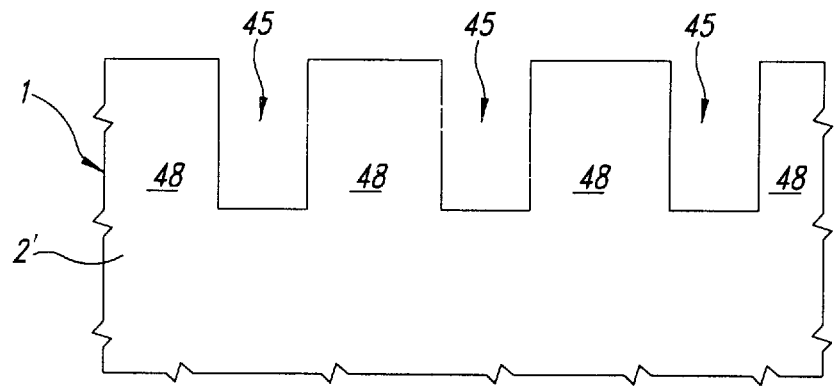
Figure 12:
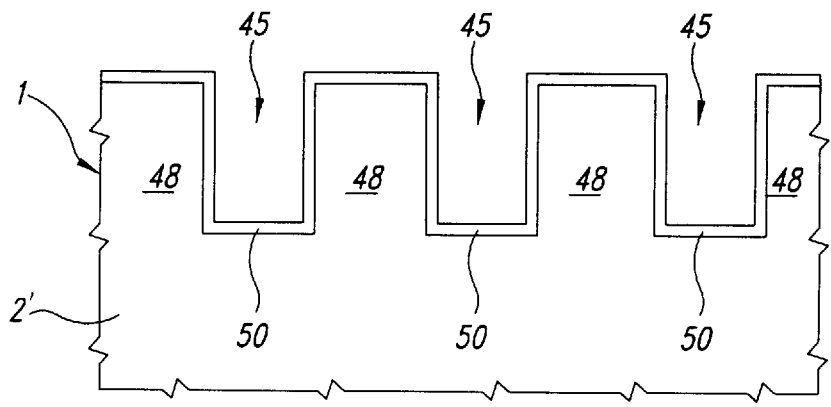

According to this process, just as for the previous process described with reference to FIGS. 1 to 8, on the surface 3 of the substrate 2 of monocrystalline silicon, a "hard" mask is formed, indicated as a whole by 9 and comprising protective regions 7, using the hard mask 9, the uncovered portions of the substrate 2 are etched so as to form trenches 45 separated from each other by protruding regions or "columns" 48 of monocrystalline silicon extending vertically from the base portion 2'(FIG. 10). Preferably, the trenches have a depth comprised between 1 and 3 µm and a width comprised between 0.3 and 2 µm.

Subsequently (FIG. 11), the hard mask 9 is removed and (FIG. 12) a protective layer 50 of silicon oxide having a thickness comprised between 10 and 20 nm is formed (for example, thermally grown) so that the surface of the silicon is not damaged in subsequent manufacturing steps.

Figure 13:
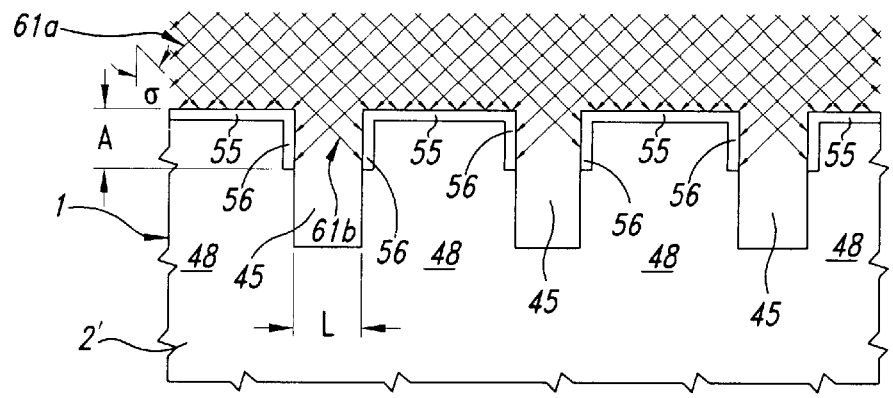

Next, nitrogen ($N_2^+$ and $N^+$ ions) is angle-implanted as represented schematically by the arrows 61a and 61b in FIG. 13, wherein, for simplicity, the protective layer 50 is no longer shown. As a rule, the angle-implant step comprises two subsequent implants, of which a first implant (arrows 61a) is made by inclining the silicon wafer at an angle η comprised between 7° and 60°, which causes ions to be implanted at the same angle η with respect to the vertical, and a second implant (arrows 61b) is made symmetrically with respect to the first implant (i.e., with an angle of −η).

In this step, the columns 48 partially shield the implant on the walls of the adjacent columns 48. In particular, the implant reaches a depth A which depends both on the angle η and on the width L of the trenches 45 (A=L/tanη). In addition, the dose D implanted on the walls of the trenches 45 is linked to the implant dose $D_i$ by the relation $D=D_i \sin η$. For example, the implant dose $D_i$ can be $2-5 \times 10^{17}$ at/cm² at an energy E=20–30 keV. Hence, first masking regions 55 are formed on the tips of the columns 48 and have a first concentration, in that they receive both the angled implants, and second masking regions 56 are formed on the top part of the walls of the trenches 45 and have a lower concentration. The bottom part of the walls and the bottom of the trenches 45 are not, instead, implanted.

Figure 14:
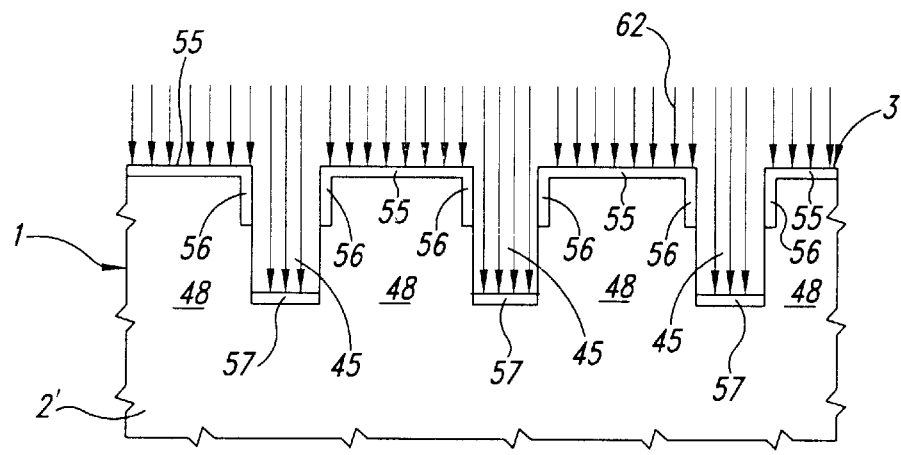
Figure 15:
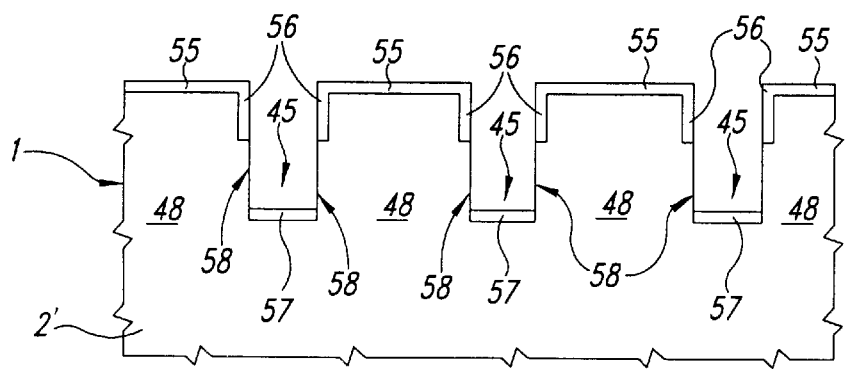

After angle-implant, as represented schematically in FIG. 14 by the arrows 62, nitrogen is then implanted, keeping the wafer 1 horizontal (implant perpendicular to the surface 3 of the wafer 1). This implant reaches the bottom of the trenches 45 and forms retarding regions 57; in addition, it increases the concentration of nitrogen ions in the first masking regions 55 on the tips of the columns 48. This implant is performed at a lower dose than the angle-implant; for example, the implant dose $D_i$ is here $10^{16}-10^{17}$ at/cm² with an energy of about 20–30 keV.

Consequently, at the end of the implantation process the wafer 1 has first and second masking regions 55 and 56, at high doses, on the tips of the columns 48 and on the top part of the walls of the trenches 45; retarding regions 57, at low doses, on the bottom of the trenches 45; and surface portions 58, not implanted, on the bottom part of the walls of the trenches 45, where the monocrystalline silicon of the columns 48 is bare.

Subsequently, an annealing step is carried out for 1–16 hours at a temperature of approximately 1000° C. Next, an oxidation step is carried out, during which silicon portions are converted gradually into silicon oxide. In detail, initially oxide regions grow horizontally, at the expense of the silicon regions, towards the inside of the columns 48 starting from the surface portions 58 of the side walls of the trenches 45, while the retarding regions 57 temporarily protect the base portion 2'. Because of the far from high concentration of nitrogen in the retarding regions 57, these form, however, only a temporary barrier, and hence, after a first phase, the thermal oxidation proceeds also downwards into the base portion 2'. The masking regions 55 and 56 continue, instead, to protect the tips 60 of the columns 48 also in this second step.

Figure 16:
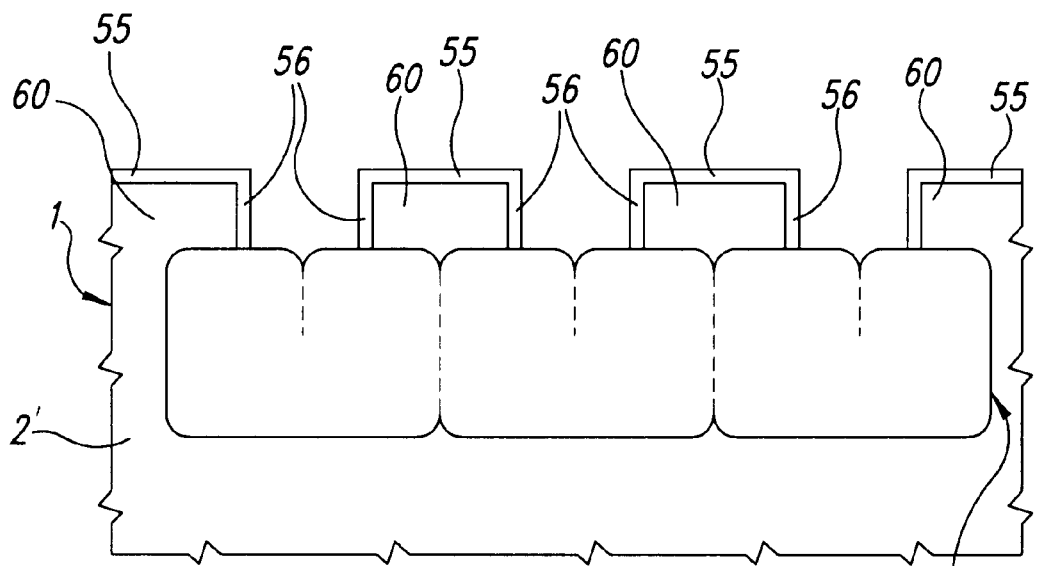
Figure 17:
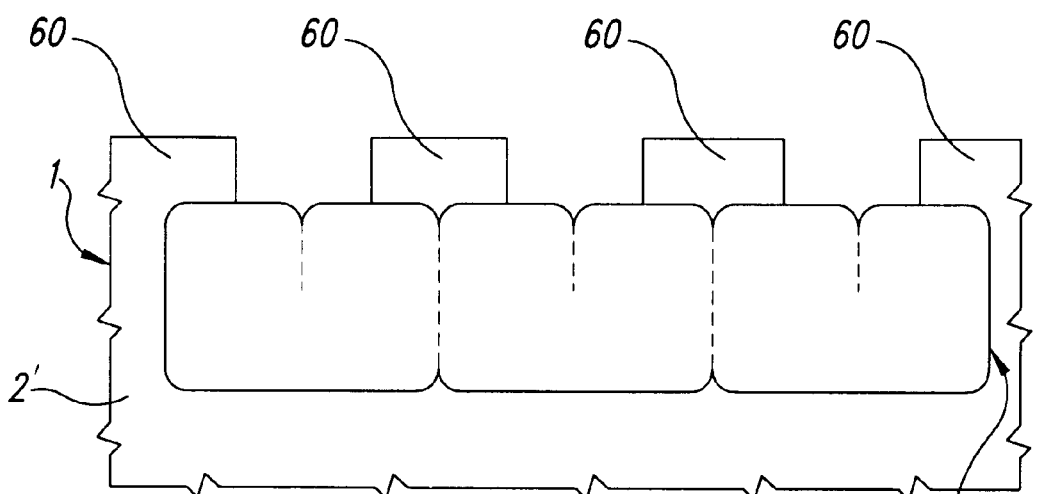

During oxidation, volume increases, and consequently the oxide regions being formed occupy, gradually, the space of the bottom portion of the trenches 45 until they completely close this bottom portion and join together, as shown in FIG. 16, to assume a substantially parallelepipedal shape. At the end of oxidation, the bottom part of the columns 48 and the top part of the base portion 2' are completely oxidized to form a continuous buried oxide region 65, shown in FIG. 16, wherein the vertical dashed lines indicate the surfaces on which the oxide regions being formed meet, starting from two adjacent trenches 45.

Subsequently (FIG. 17), the masking regions 55 and 56 are removed by selective etching using phosphoric acid, so as to uncover the tips 60 of the columns 48 which are to form the nucleus for a subsequent epitaxial growth step.

Figure 18:
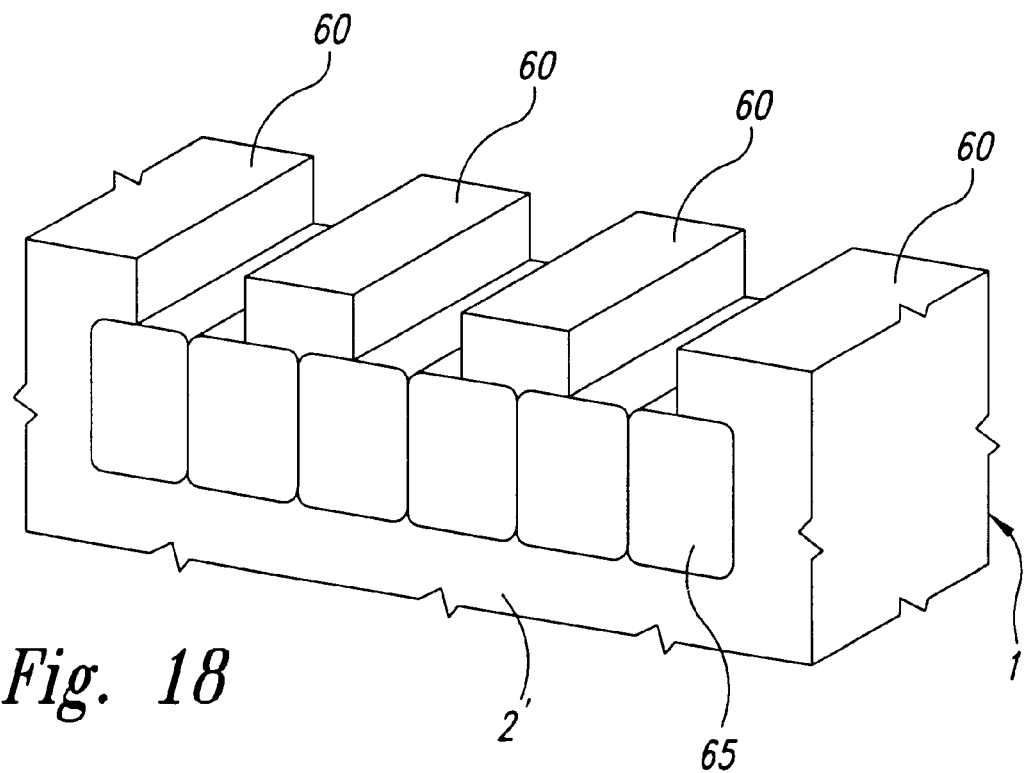
FIGS. 18 and 19 present perspective cross sections in two successive steps according to the present process.
Figure 19:
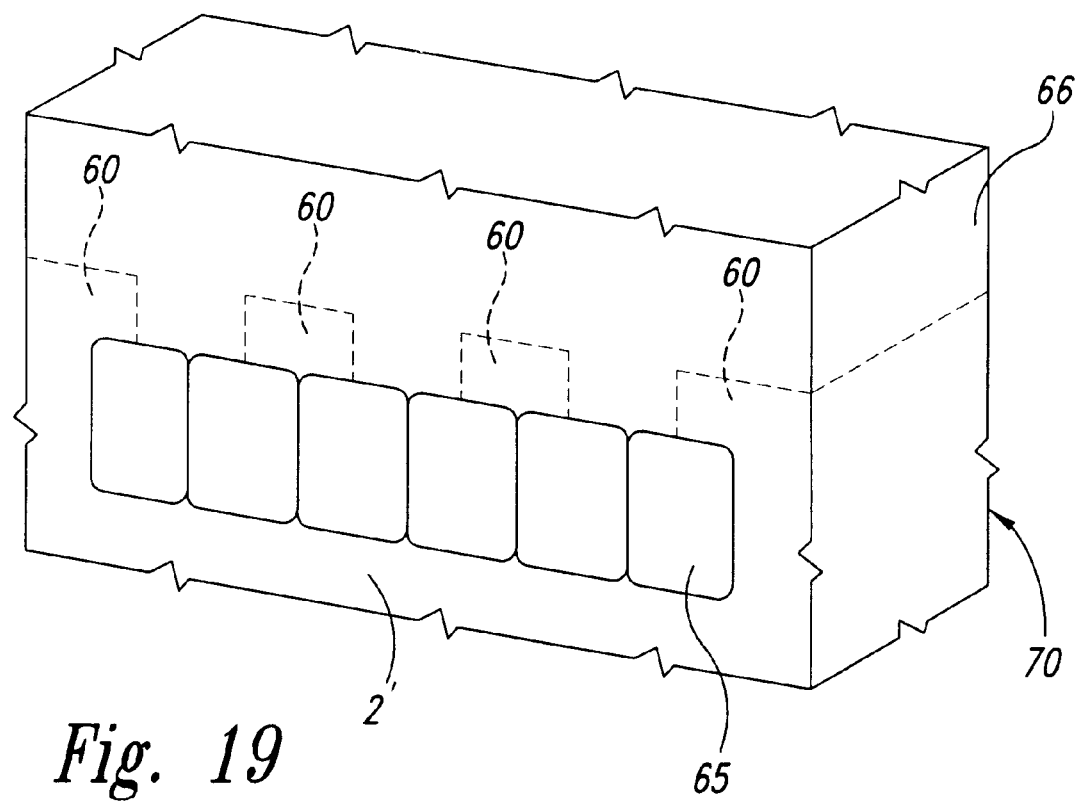

The structure of FIG. 18, which shows the three-dimensional structure of the wafer 1 in this step, is obtained. Subsequently, as for the previous process described above, an epitaxial layer 66 is grown. Then, after a possible chemical and mechanical lapping step to flatten the top surface, the final wafer 70 is obtained, as shown in FIG. 19.

Figure 1:
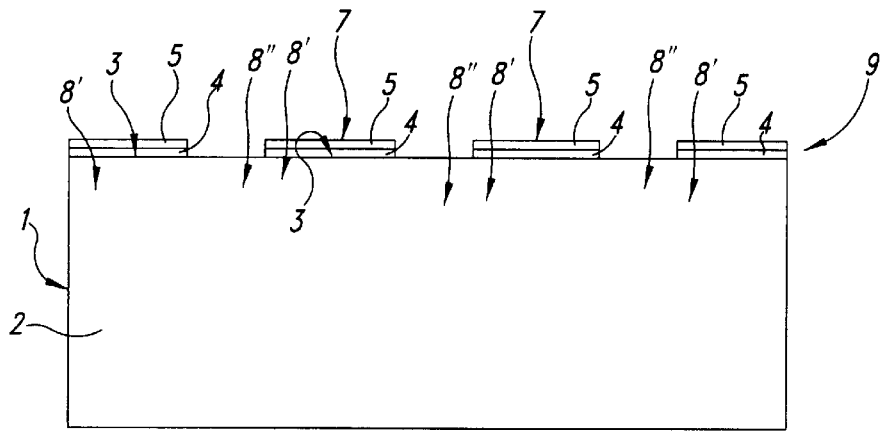
FIGS. 1 to 6 show cross sections through a SOI wafer in successive manufacturing steps according to a previous process.
Figure 2:
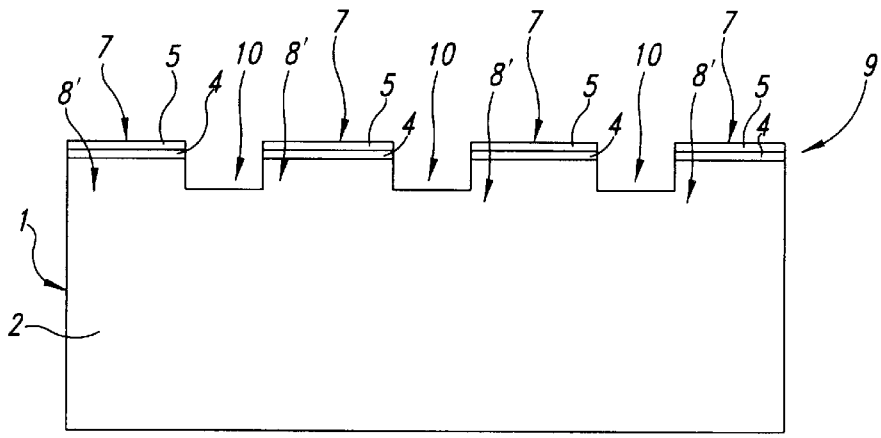
Figure 3:
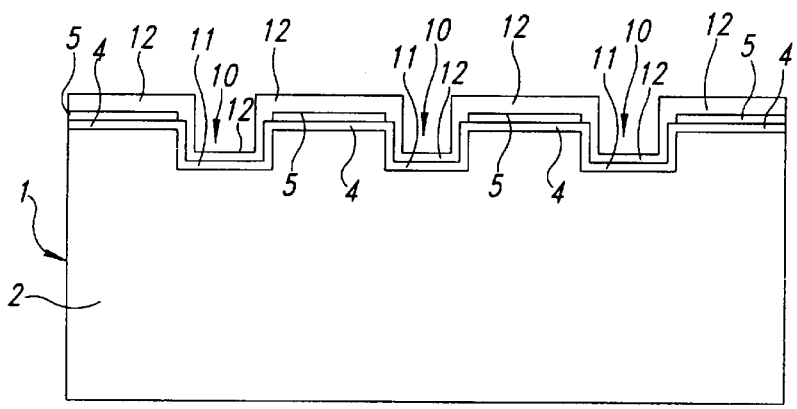
Figure 4:
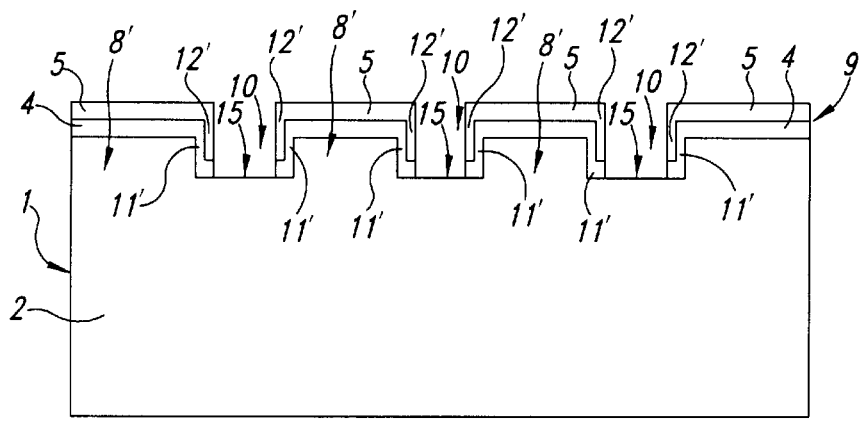
Figure 5:
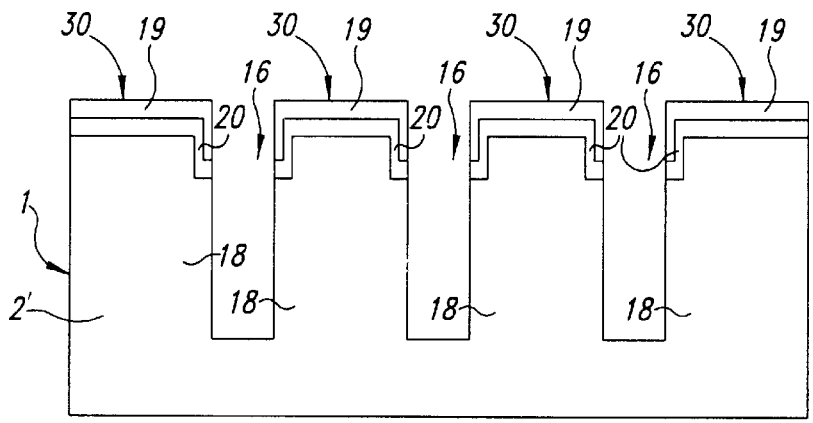
Figure 6:
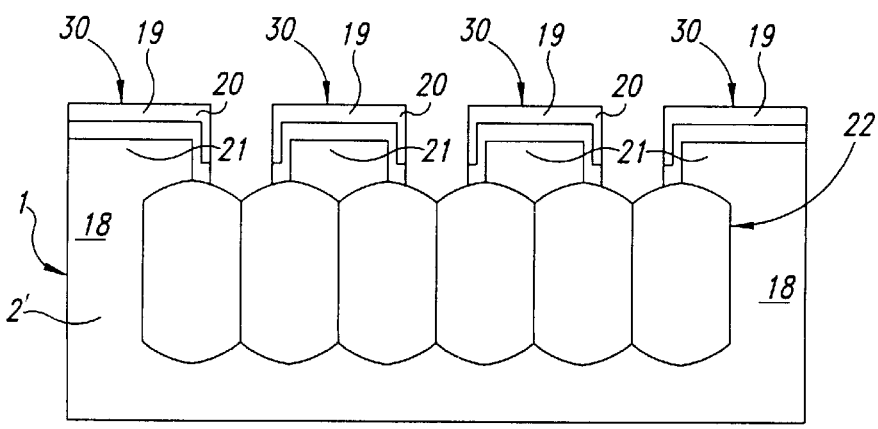
Figure 7:
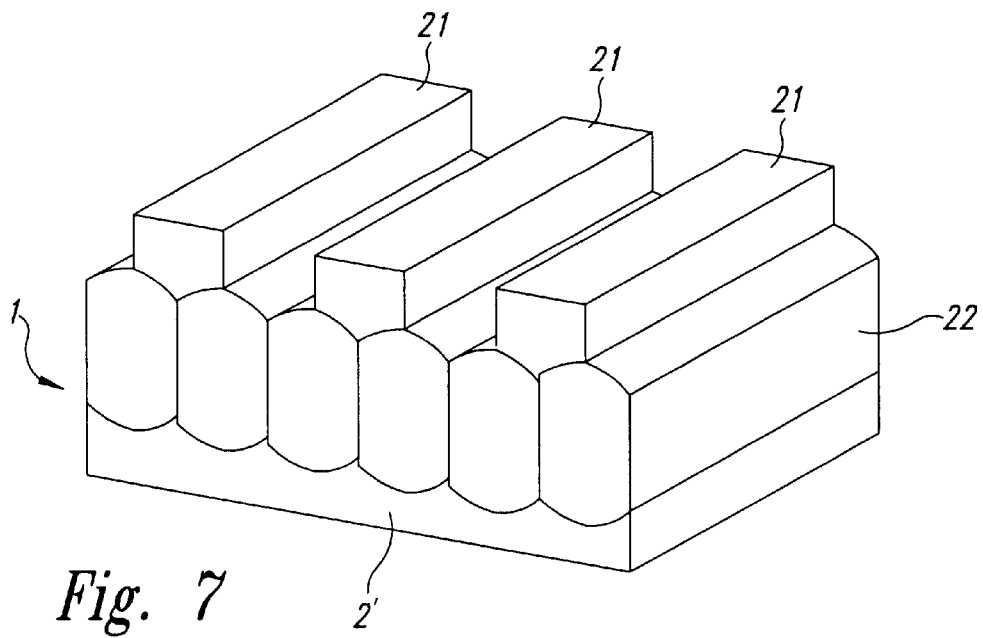
FIGS. 7 and 8 present perspective cross sections in two successive steps of the previous manufacturing process.
Figure 8:
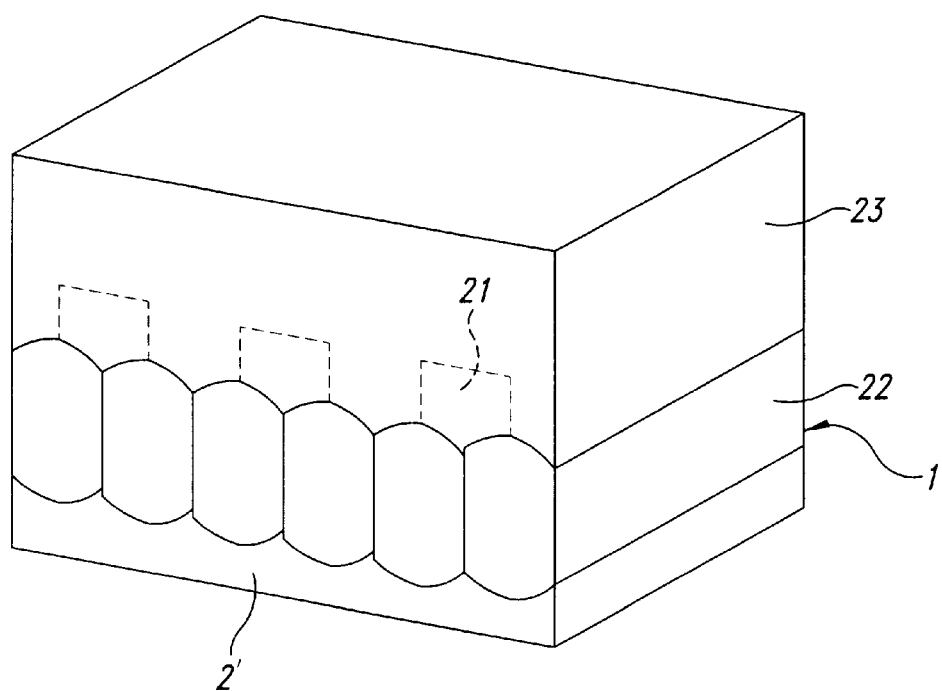
Figure 20:
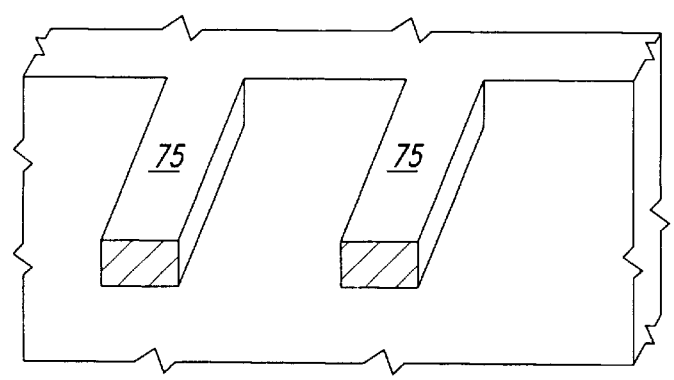
FIG. 20 presents a perspective cross section of a suspended structure obtained starting from a SOI wafer made according to the present process.
Figure 21:
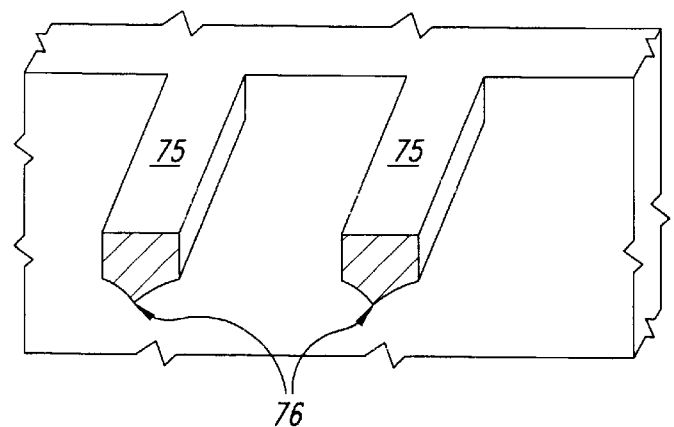
FIG. 21 presents a cross section analogous to that of FIG. 20 for a suspended structure obtained from a SOI wafer made according to the previous solution of FIGS. 1 to 8.
Figure 9:
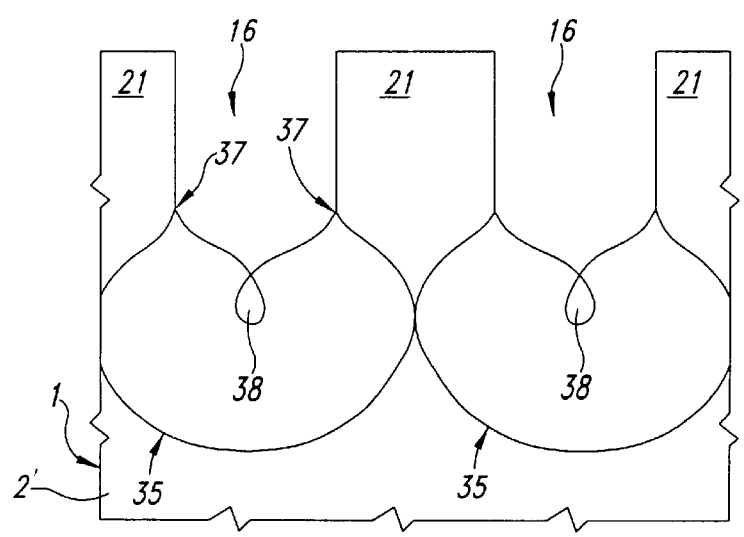
FIG. 9 shows a detail of FIG. 6 on an enlarged scale.

With the described process, it is thus possible to manufacture wafers having a buried oxide region 65 of a practically parallelepipedal shape and, in the case of removal of the buried oxide region 65, it is possible to obtain suspended structures with contours of a substantially rectangular shape, indicated by 75 in FIG. 20, instead of structures presenting a cusp, indicated by 76 in FIG. 21, as those obtained using the previous process.

Finally, it is clear that numerous modifications and variations can be made to the process described and illustrated herein, all of which falling within the scope of the invention, as defined in the attached claims. In particular, it is pointed out that it is possible to reverse the order of the implants, and first carry out the nitrogen implant with the wafer 1 horizontal. The oxidation step for forming the protective layer 50 can, moreover, be omitted. Thus, the invention is to be limited only by the scope of the claims that follow and the equivalents thereof.

What is claimed is:

1. A process for manufacturing a SOI wafer comprising:
   forming trenches in a wafer of monocrystalline semiconductor material, said trenches extending between, and delimiting laterally, protruding portions of said wafer;
   oxidizing at the bottom of said protruding portions to form at least one continuous buried oxide region overlaid by nucleus regions of said monocrystalline semiconductor material, oxidizing at the bottom of said protruding portions comprising initially oxidizing bottom portions of said protruding portions;
   subsequently oxidizing said wafer underneath said trenches and underneath said bottom portions of said protruding portions; and
   epitaxially growing a layer of crystalline semiconductor material starting from said nucleus regions.

2. The process of claim 1, further comprising, after said step of forming trenches:
   forming masking regions surrounding, at the top and at the sides, top portions of said protruding portions;
   forming retarding regions on the bottom of said trenches;
   said masking regions and said retarding regions delimiting between each other oxidizable surfaces surrounding said bottom portions of said protruding portions.

3. The process of claim 2 wherein forming masking regions comprises introducing nitrogen ions at a first concentration, and said forming retarding regions comprises introducing nitrogen ions at a second concentration that is lower than the first concentration.

4. The process of claim 2 wherein forming masking regions and forming retarding regions comprise:
   carrying out a vertical implant of nitrogen ions in a direction substantially perpendicular to the surface of said wafer; and
   carrying out an angle implant of nitrogen ions in a direction inclined with respect to said perpendicular direction.

5. The process of claim 4 wherein said inclined direction forms an angle comprised between 7° and 60° with said vertical direction.

6. The process of claim 4 wherein performing a vertical implant is carried out with a dose of $10^{16}$–$10^{17}$ and at an energy of 20–30 keV, and said step of performing an angle implant is carried out with a dose of 2–5×$10^{17}$ at/cm$^2$ and at an energy of 20–30 keV.

7. The process of claim 6 wherein performing an angle implant is carried out before said step of performing a vertical implant.

8. The process of claim 7, further comprising removing said masking regions before said step of epitaxial growth.

9. The process of claim 1 wherein said trenches extend along parallel strips.

10. The process of claim 1 wherein said trenches have a width of 0.3–2 µm.

11. The process of claim 1, further comprising growing a protective oxide layer after forming trenches and before oxidizing at the bottom.

12. A process for manufacturing buried oxide regions in a SOI wafer, comprising:
    forming a plurality of trenches in a wafer of monocrystalline semiconductor material, the trenches having vertical side walls with a top portion and a bottom portion;
    forming a masking region on a top of the wafer and a masking region at the top portion of the vertical side walls of the trenches;
    oxidizing bottom portions of the vertical side walls of the trenches; and
    oxidizing the wafer beneath the trenches and underneath the bottom portions of the vertical side walls of the trenches to form at least one continuous buried oxide region and a plurality of nucleus regions formed of said monocrystalline semiconductor material that overlie the buried oxide region.

13. The process of claim 12, further comprising epitaxially growing a layer of crystalline semiconductor material starting from the nucleus regions.

14. The process of claim 13, further comprising, after forming masking regions at the top portions of the vertical side walls of the trenches, forming retarding regions on the bottom of the trenches.

15. The process of claim 14 wherein forming the masking regions comprises introducing nitrogen ions at a first concentration.

16. The process of claim 15 wherein forming retarding regions comprises introducing nitrogen ions at a second concentration that is lower than the first concentration.

17. The process of claim 14 wherein forming masking regions on the wafer and on the top portions of the vertical side walls of the trenches comprises carrying out an angle implant of nitrogen ions in a direction inclined with respect to the perpendicular direction.

18. The process of claim 17 wherein the inclined direction forms an angle comprised between 7° and 60° with the vertical direction.

19. The process of claim 14 wherein forming retarding regions comprises carrying out a vertical implant of nitrogen ions in a direction substantially perpendicular to the surface of the wafer.

20. The process of claim 19 wherein performing a vertical implant comprises implanting nitrogen ions with a dose of $10^{16}$–$10^{17}$ and at all energy of 20–30 keV, and said step of performing an angle implant of nitrogen ions is carried out with a dose of 2–5×$10^{17}$ at/cm$^2$ and at an energy of 20–30 keV.

* * * * *

UNITED STATES PATENT AND TRADEMARK OFFICE
CERTIFICATE OF CORRECTION

PATENT NO.   : 6,362,070 B1
DATED        : March 26, 2002
INVENTOR(S)  : Flavio Villa et al.

It is certified that error appears in the above-identified patent and that said Letters Patent is hereby corrected as shown below:

Column 6,
Line 62, "and at all energy of 20-30 keV," should read -- and at an energy of 20-30 keV, --.

Signed and Sealed this

Ninth Day of July, 2002

Attest:

JAMES E. ROGAN
Attesting Officer   Director of the United States Patent and Trademark Office